United States Patent [19]
Nichogi et al.

[11] Patent Number: 5,223,750
[45] Date of Patent: Jun. 29, 1993

[54] ARTIFICIAL NEURAL FUNCTION CIRCUIT HAVING ORGANIC THIN FILM ELEMENTS

[75] Inventors: Katsuhiro Nichogi, Kawasaki; Akira Taomoto, Yokohama; Shiro Asakawa, Machida; Kunio Yoshida, Kawasaki, all of Japan

[73] Assignee: Matsushita Research Institute Tokyo, Inc., Kawasaki, Japan

[21] Appl. No.: 698,148

[22] Filed: May 10, 1991

[30] Foreign Application Priority Data

Jun. 4, 1990 [JP] Japan .................. 2-145661

[51] Int. Cl.$^5$ .............................. G06G 7/06
[52] U.S. Cl. ........................ 307/201; 395/24; 257/40
[58] Field of Search ............... 365/163, 167; 395/24; 357/8; 307/201

[56] References Cited

U.S. PATENT DOCUMENTS

| | | | |
|---|---|---|---|
| 4,660,166 | 4/1987 | Hopfield | 307/201 X |
| 4,782,460 | 11/1988 | Spencer | 307/201 X |
| 4,873,455 | 10/1989 | de Chambost et al. | 307/201 |
| 4,945,257 | 7/1990 | Marrocco, III | 307/201 |

FOREIGN PATENT DOCUMENTS 0244678 10/1988 Japan ..................... 357/8

Primary Examiner—David R. Hudspeth
Attorney, Agent, or Firm—Stevens, Davis, Miller & Mosher

[57] ABSTRACT

An artificial neural function circuit includes an organic thin film element having a resistance state which changes in dependence on an electrical signal inputted thereto and exhibits information processing function similar to that of a nervous system. The organic thin film element has such physical properties that the changed resistance state is held as it is at least for a predetermined time period even after removal of the electric input signal and that the direction in which the resistance is increased or decreased depends on the polarity of the electric input signal. As an example of such organic thin film, a lead phthalocyanine thin film is employed.

8 Claims, 4 Drawing Sheets

ARTIFICIAL NEURAL FUNCTION CIRCUIT HAVING ORGANIC THIN FILM ELEMENTS

BACKGROUND OF THE INVENTION

1. Field of the Invention

The present invention relates to an artificial neural function circuit which is useful in the electric/electronic industries and more particularly in the information processing industry.

2. Description of the Prior Art

In recent years, active studies have been conducted on a novel information processing system which simulates the information processing functions of a cerebrum or nerve, i.e. a so-called neuro-computer or neural net. In reality, the neural nets have been developed up to the level where they can find applications in a variety of systems including a character recognition system and others. The novel information processing functions are realized in hardware or software by making use of existing inorganic semiconductor devices, impedance circuits and the like.

By the way, Hopfield has shown that a function of a neural net realized in the form of an impedance circuit constituted by amplifiers, resistors and capacitors converges to a minimum value, thus making it possible to solve combinatorial problems. Further, it has been demonstrated that the neural net can effectively be applied to associative storages, pattern recognition systems, etc. For these reasons, the neural net has attracted attention as a promising information processing unit.

It is however noted that realization of such novel information processing functions in software or hardware relies on the use of existing semiconductor device or combinations thereof, resulting in the neural net of a complicated structure, presenting difficulties in actual applications. Besides natural limitations exist on the attempt for microstructural realization of the elements and functions.

SUMMARY OF THE INVENTION

In view of the state of the art described above, it is an object of the present invention to provide an artificial neural circuit which is capable of information processings similar to those of the neural system and which can be implemented in a simplified and compact structure while ensuring capability of highly intelligent functions.

The above and other objects which will be apparent as description proceeds, there is provided according to a general aspect of the present invention an artificial neural function circuit which incorporates an organic thin film element exhibiting variable resistance states in response to application of electric input signals.

In a preferred embodiment of the invention, the organic thin film element holds the resistance state as attained for a predetermined duration even after removal of the applied electric signal.

In another preferred embodiment of the invention, the thin film element has such physical property that the direction in which the resistance state is changed (i.e. resistance is increased or decreased) depends on the polarity of the electric input signal. As a thin film which can exhibit such physical property, there may be mentioned a lead phthalocyanine thin film, although the invention is not restricted to use thereof.

Because of the organic thin film element incorporated in the artificial neural function circuit according to the invention, the latter can be implemented in a much simplified structure when compared with the hitherto known circuit using the existing semiconductor devices and thus exhibit excellent practical applicability. Besides, since the organic thin film element can readily be imparted with a great variety of characteristics, realization of a compact structure (microstructurization of elements) can be accomplished while assuring enhanced intelligent functions.

In particular, when the organic thin film element is capable of holding or maintaining the attained resistance state at least for a predetermined time even after removal of the electric input signal and/or when the direction of change (increase/decrease) of the resistance state depends on the polarity of the electric input signal, as in the case of the lead phthalocyanine thin film, highly intelligent functions as well as microstructurization can be easily realized.

DESCRIPTION OF THE PREFERRED EMBODIMENTS

Before entering into detailed description of the preferred or exemplary embodiments of the present invention, electric characteristics of an organic thin film element will be discussed by taking as an example an element composed of a lead phthalocyanine thin film deposited under vacuum in a thickness of 1.2 $\mu$m and having a bottom electrode mounted on a rear surface and a top electrode mounted on an upper surface.

Figure 2:
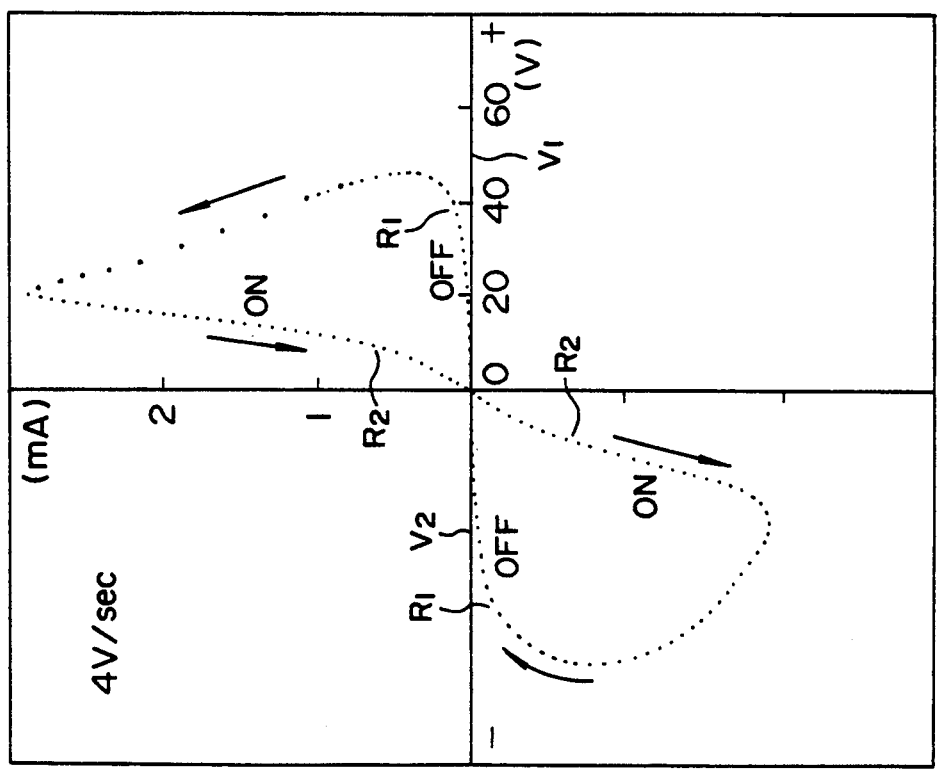

In the thin film element of the structure mentioned above, the top electrode is connected to the ground potential while a plus-minus sweep voltage (electric input signal) is applied to the bottom electrode at a rate of 4 V/sec to thereby cause the resistance of the thin film element to be changed. Then, the thin film element undergoes such a change in resistance as illustrated in FIG. 2.

Referring to the figure, it can be seen that the lead phthalocyanine thin film assumes initially a high resistance state $R_1$. However, when the sweep voltage is increased beyond a plus voltage $V_1$, the resistance state of the lead phthalocyanine thin film is changed to a low resistance state $R_2$ after having passed through a negative resistance region. Thereafter, when the sweep voltage exceeds a minus voltage $V_2$, the thin film element resumes the initial high resistance state $R_1$ after passing through a negative resistance region. In this manner, the lead phthalocyanine thin film element reciprocates between the high resistance state $R_1$ and the low resistance state $R_2$ during a single sweep of the applied voltage between values of the opposite polarities.

When the minus voltage sweep is not performed in succession to the low resistance state $R_2$ occurring when the plus voltage $V_1$ is exceeded but the electric input signal is removed, the thin film element is held in the low resistance state $R_2$. However, this low resistance state $R_2$ can not be sustained permanently but the high resistance state $R_1$ is resumed of itself after lapse of a predetermined time period. Of course, such thin film element may also be made to remain in the low resistance state $R_2$ continuously instead of resuming spontaneously the high resistance state $R_1$ even after lapse of the predetermined time duration.

Figure 3:
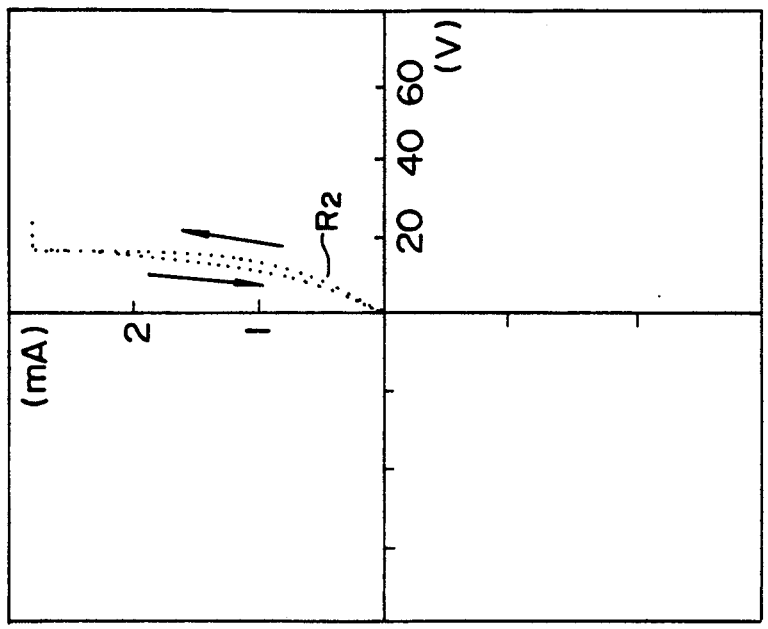
FIGS. 2 to 4 are characteristic diagrams showing voltage-current characteristics of an organic thin film employed in the artificial neural function circuit.
Figure 4:
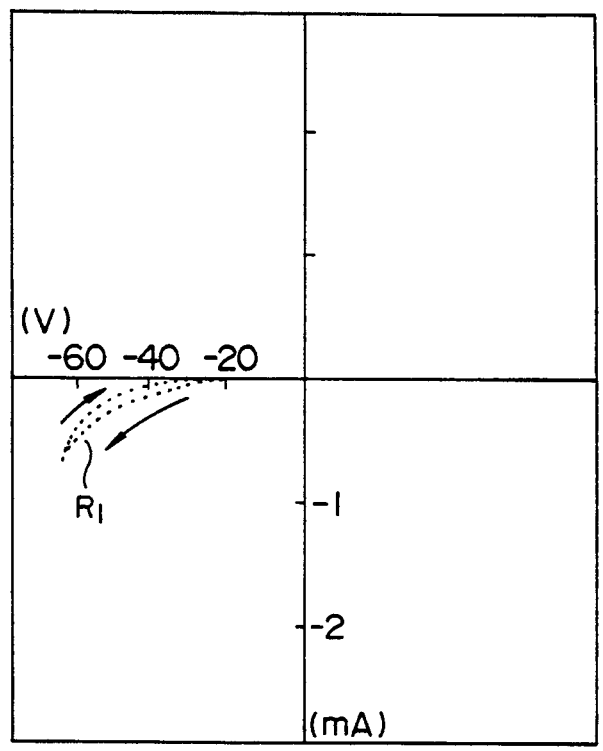

On the other hand, when the plus voltage sweep is again performed after the transition to the low resistance state $R_2$ in place of the minus voltage sweep, the resistance of the lead phthalocyanine thin film changes in accordance with a voltage-current characteristic curve illustrated graphically in FIG. 3. In this case, no change occurs in the thin film element held in the low resistance state $R_2$ either. Conversely, any minus voltage sweep performed in the initial high resistance state $R_1$ of the thin film element can never bring about the transition to the low resistance state $R_2$, but the thin film element simply undergoes a change in resistance in accordance with a voltage-current characteristic curve illustrated in FIG. 4, and the element is held in the high resistance state $R_1$. It can thus be understood that the direction in which the resistance of the lead phthalocyanine thin film is changed (increased or decreased) depends on the polarity of the applied voltage (electric input signal).

Figure 5:
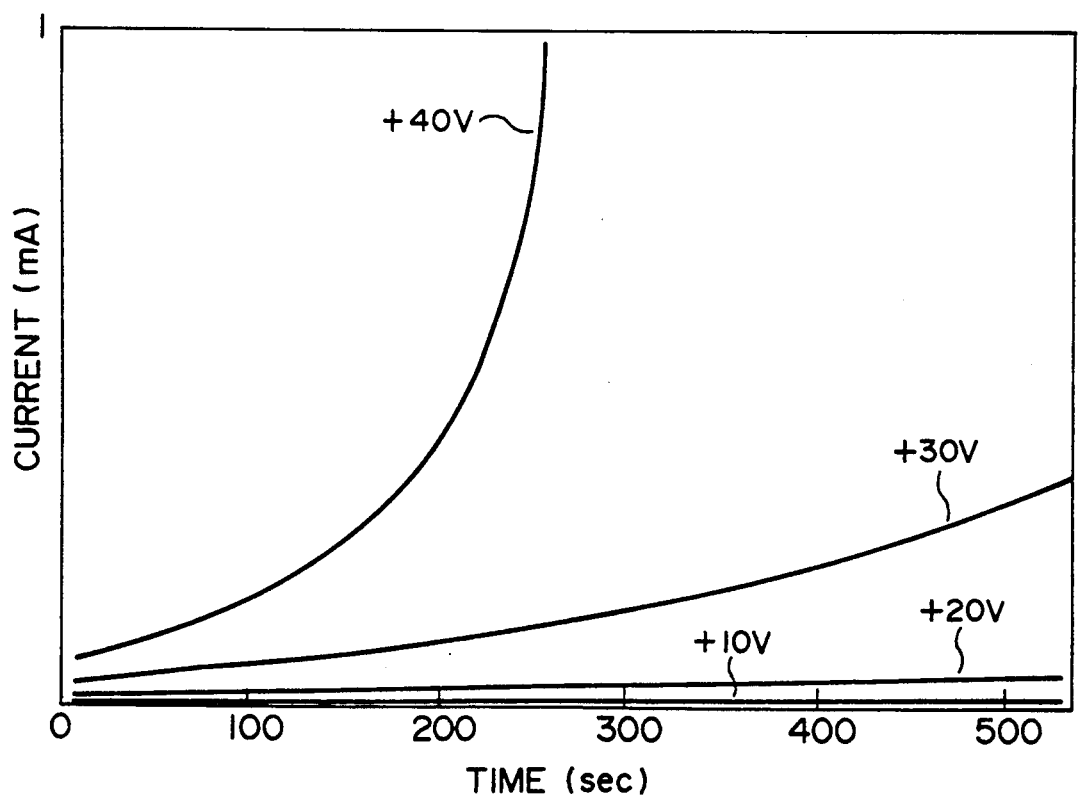
FIG. 5 is a characteristic diagram for illustrating changes of a current flow produced in response to application of a predetermined voltage as a function of time lapse.

Next, the relationship between the value of voltage and response time of the lead phthalocyanine thin film element will be considered by reference to FIG. 5.

As can be seen in this figure, the rate of change of the resistance value (i.e. the rate of change from a high resistance state to a low resistance state) depends on the applied voltage. More specifically, as the voltage applied across the thin film element is increased, the time taken for the element to change from the high resistance state to the low resistance state becomes shorter. Further, the value of resistance in the low resistance state as attained exhibits dependency on the applied voltage. For a given duration of voltage application, the value of the resistance as attained becomes lower, as the applied voltage is increased. It goes without saying that every resistance state as attained is maintained at least for a predetermined time even after removal of the applied voltage. It will thus be appreciated that the lead phthalocyanine thin film element can exhibit a memory function to store the intermediate resistance states between the high resistance state $R_1$ and the low resistance state $R_2$ and thus serve as a multi-value memory element.

Figure 6:
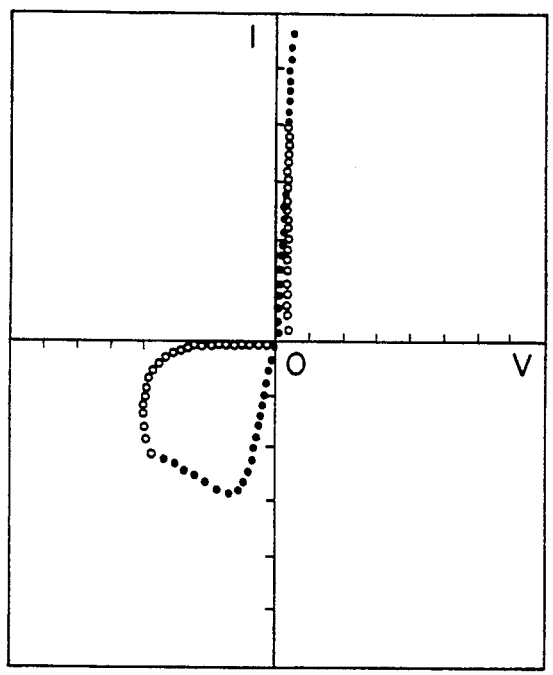
FIG. 6 is a characteristic diagram showing another voltage-current characteristic of an organic thin film element.

FIG. 6 shows graphically a voltage-current characteristic of a lead phthalocyanine thin film element which slightly differs from that shown in FIG. 2. Referring to FIG. 6, the current rises up steeply in the plus voltage region, and the voltage-current characteristic curve is asymmetrical with reference to the origin O. Consequently, the lead phthalocyanine thin film element transits to a low resistance state immediately upon application of a voltage in the plus voltage sweep, while restoration to a high resistance state in the minus voltage sweep takes considerable time. In other words, in the case of the lead phthalocyanine exhibiting the voltage-current characteristic illustrated in FIG. 6, transition from the high resistance state to the low resistance state takes place at a high speed, while the transition in the reverse direction is effected only slowly.

By virtue of the capability of an organic thin film element formed of lead phthalocyanine to undergo a variety of resistance changes as described above, the organic thin film element can readily exhibit highly intelligent functions. By way of the example, as one of important functions of a nerve cell or neuron, there can be mentioned plasticity of synaptic coupling. With the phrase "plasticity of synaptic coupling", it is contemplated to mean that the strength or degree of the synaptic coupling varies in dependence on magnitude of input stimulus and a number of times the stimuli are applied. By virtue of such plasticity of the synaptic coupling, information processing in organisms is made possible. Thus, by using the organic thin film capable of exhibiting a variety of resistance changes, a circuit capable of performing operations similar to those of the neuron can easily be implemented.

It should be mentioned that the present invention is not restricted to the arrangements described above. For example, the organic thin film element may be made of another material than lead phthalocyanine. Further, the electric input signal may be applied in the form of a electric current.

Figure 1:
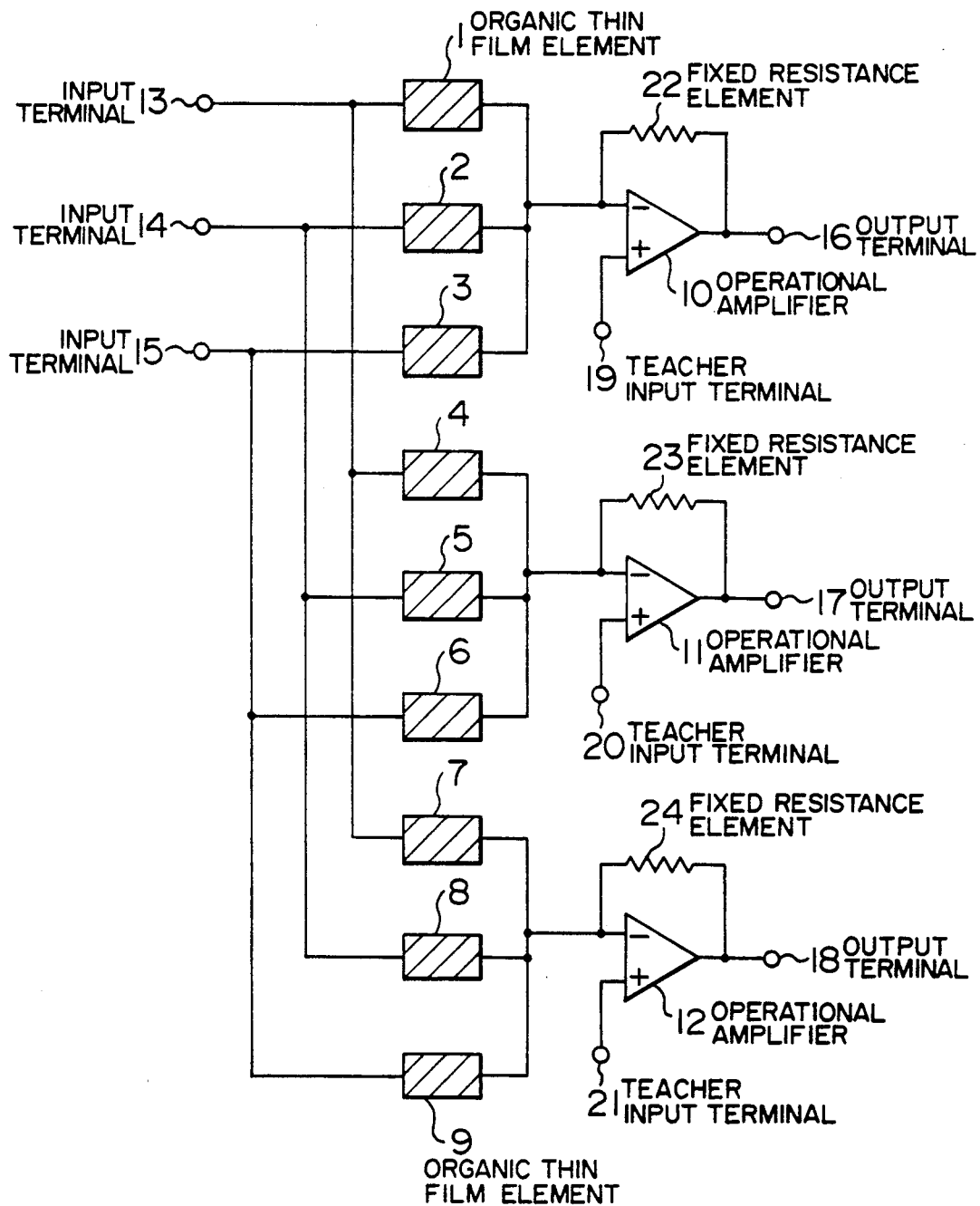
FIG. 1 is a diagram showing a circuit configuration of an artificial neural function circuit according to an embodiment of the invention.

FIG. 1 shows an artificial neuron function circuit according to an embodiment of the present invention.

Referring to the figure, the artificial neural function circuit includes nine organic thin film elements 1 to 9, three operational amplifiers 10 to 12, three input terminals 13 to 15, and three output terminals 19 to 21. Reference numerals 22 to 24 denote fixed resistance elements, respectively.

The organic thin film elements 1 to 3 have one of their sides connected to associated ones of the input terminals 13 to 15, respectively, and their other sides connected together to an inverted input terminal (minus terminal) of the operational amplifier 10. The organic thin film elements 4 to 6 have one of their sides connected to the input terminals 13 to 15, respectively, and their other sides connected together to an inverted input terminal of the operational amplifier 11. Finally, the organic thin film elements 7 to 9 have one of their sides connected to the input terminals 13 to 15 and their other sides connected together to an inverted input terminal of the operational amplifier 12. The teacher input terminals 19 to 21 are connected to non-inverted input terminals (plus terminals) of the operational amplifiers 10 to 12, respectively.

Each of the organic thin film elements 1 to 9 is composed of a lead phthalocyanine thin film and can exhibit a variety of characteristics described hereinbefore by reference to FIGS. 2 to 5. More specifically, each of the thin film elements is composed of a substrate of an electrically insulating material having a surface formed with a gold film through vapor deposition to serve as a bottom electrode, a lead phthalocyanine thin film (organic thin film) stacked in a thickness of 1.2 $\mu$m through a vacuum vapor deposition method and a gold film formed on the lead phthalocyanine film through vapor deposition to serve as a top electrode.

Now, description will be directed to operation of the artificial neural function circuit shown in FIG. 1.

At first, electric input signals of $+10$ volts, $+5$ volts and 0 volt are applied to the input terminals 13, 14 and 15, respectively, while electric input signals of 0 volt are applied to the teacher input terminals 19 to 21, respectively. In that case, voltages making appearance across the organic thin film elements 3, 6 and 9, respectively, are 0 volt, the voltages appearing across the elements 2, 5 and 8, respectively, are of +5 volts, and the voltages across the thin film elements 1, 4 and 7 are of +10 volts, respectively. As a consequence, although the organic thin film elements 3, 6 and 9 remain in a high resistance state, the organic thin film elements 2, 5 and 8 are caused to assume a low resistance state, while the organic thin film elements 1, 4 and 7 are set to a lower resistance state. Since magnitudes of the input signals to the individual operational amplifiers 10 to 12 are equal to one another, outputs of a same magnitude are produced from the output terminals 16 to 18, respectively.

Next, when a voltage of +20 volts is applied to the teacher input terminals 20 and 21, respectively, while maintaining the teacher input terminal 19 at 0 volt as it is, each of the organic thin film elements 4 to 9 is applied with a sufficiently high minus voltage to allow these element to resume the high resistance state. Needless to say, the organic thin film elements 1 to 3 which are free of the minus voltage remain in the low resistance state. Consequently, the outputs disappear from the output terminals 17 and 18 with only the output at the terminal 16 being maintained as it is.

Even when the voltages applied to the input terminals and the teacher input terminals are removed, the resistance states of the individual organic thin film elements remain unchanged. Accordingly, when the same voltage is again applied to the input terminals 13 to 15 at a succeeding time point, the output signal makes appearance only at the output terminal 16. By changing the pattern of voltages applied to the teacher input terminals, it is possible to cause the output signal to be produced from the output terminals 17 and 18 as well. In this way, differences among input patterns can be discriminatively identified by detecting output patterns produced at the output terminals.

As another embodiment of the present invention, an artificial neural function circuit is implemented in utterly the same structure as that shown in FIG. 1 except that each of the organic thin film elements is imparted with the characteristic illustrated in FIG. 6 in place of that shown in FIG. 2. The input voltages of +10 volts, +5 volts and 0 volt are applied to the input terminals 13, 14 and 15, respectively, as in the case of the preceding embodiment. On the other hand, applied to the teacher input terminals 19, 20 and 21 are 0 volt, +5 volts and +5 volts, respectively. In this case, only the thin film element 1 assumes the lowest resistance state to thereby allow a highest output signal to be produced from the output terminal 16. This state of the artificial neural circuit is maintained even when the voltages applied to the input terminals 13, 14 and 15 and the teacher input terminals 19, 20 and 21 are removed. Accordingly, when the input voltages of the same pattern are subsequently applied to the input from the output terminal 16. In this conjunction, it is further noted that the transition from the low resistance state to the high resistance state takes place at a low speed or rate while transition from the high resistance state to the low resistance state takes place at a high speed. As a result of this, learning can be accomplished within a short time with enhanced insusceptibility to lapse of memory. Since the outputs can be obtained from the output terminals 17 and 18, respectively, by changing the input voltage pattern, differences among the input patterns can be discriminatively identified on the basis of the detected outputs.

Figure 7:
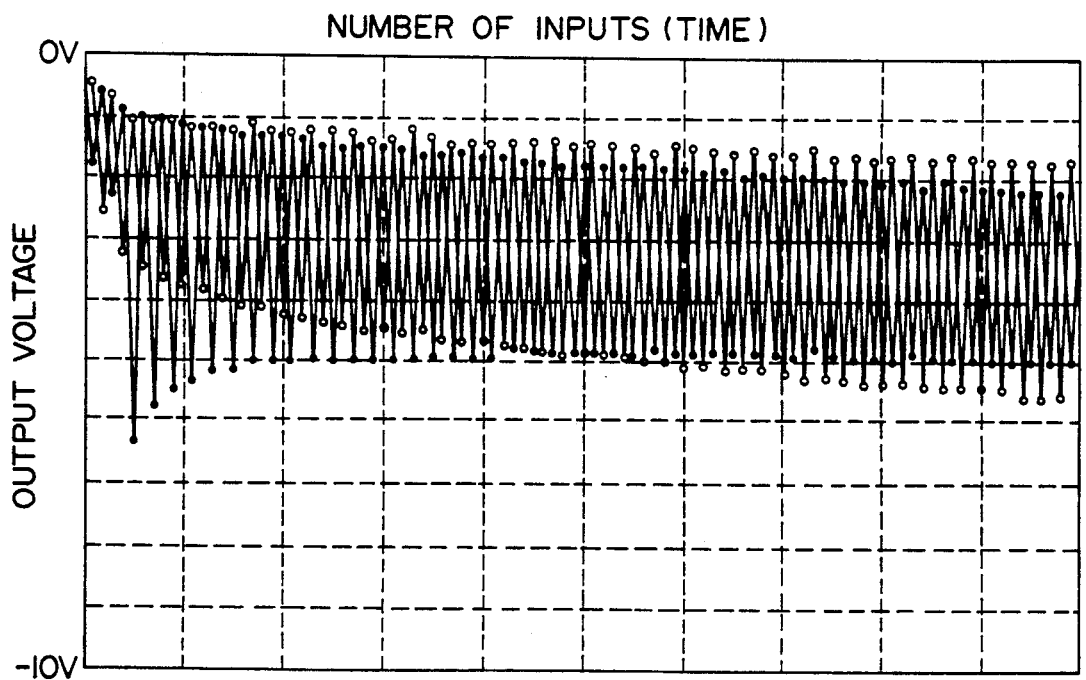
FIG. 7 is a diagram for illustrating output characteristics obtained when two patterns are recognized by an artificial neural function circuit according to an embodiment of the invention.

FIG. 7 is a chart showing the outputs produced from the output terminals 16 and 17 when two voltage patterns (+10 volts, 0 volt) and (0 volt, +10 volts) are inputted through the input terminals 13 and 14 for teaching an artificial neural circuit according to an embodiment of the invention. In this figure, hollow circles indicate the outputs from the output terminal 16, while solid circles indicate the outputs from the output terminal 17. As can be seen in the figure, output patterns of (−5 volts, −2 volts) and (−2 volts, −5 volts) can be obtained for the abovementioned input patterns, respectively, which can thus be identified discriminatively from each other.

As can now be appreciated from the foregoing, according to the teachings of the invention, a perceptron circuit which is one of the neural networks can be realized in the form of hardware by making use of physical properties of an organic material.

In practical applications, the input pattern may be of any origin. By way of example, the input pattern may be constituted by output signals of a plurality or variety of sensors. In that case, the artificial neural function circuit can find application in various types of recognition systems or the like.

In the case of the embodiments of the invention described above, the number of the input signals is assumed to be three. It should however be understood that the number of the input signals may be increased to four or more to thereby impart the artificial neural circuit with more intelligent performance.

As will be appreciated from the foregoing description, the artificial neural function circuits according to the present invention can be realized in a much simplified and compact structure with remarkably enhanced performance owing to incorporation of the organic thin film element to great advantages in practical applications.

In the case of the artificial neural function circuit of a structure according to one aspect of the invention, the organic thin film element can hold the changed resistance state at least for a predetermined time even after removal of the electric input signals. On the other hand, in the artificial neural function circuit of the structure of another aspect of the invention, the direction in which the resistance state is changed (i.e. direction in which the resistance is increased or decreased) depends on the polarity of the electrical input signal. Further, in the case of the artificial neural function circuit of the structure of yet another aspect of the invention, the rate of change of resistance in the decreasing direction is higher than that in the increasing direction. By virtue of these features, the artificial neural function circuit can readily be implemented with enhanced function capabilities.

We claim:

1. An artificial neural function circuit, comprising:
a plurality of organic thin film elements;
a plurality of input terminals;
a plurality of output terminals;
each of said organic thin film elements including an organic thin film and at least two metal electrodes, each of said metal electrodes contacting a different surface of said organic thin film, one of said metal electrodes being connected to one of said input terminals and receiving an electric input signal, and another of said electrodes being connected to one of said output terminals, wherein electrical resistance of said organic thin film changes in dependence on a said electric input signal.

2. An artificial neural function circuit according to claim 1, wherein said organic thin film holds the changed resistance state for a predetermined time period after removal of said electric input signal.

3. An artificial neural function circuit according to claim 1, wherein the direction in which the resistance state changes depends on the polarity of said electric input signal.

4. An artificial neural function circuit according to claim 2, wherein the direction in which the resistance state changes depends on the polarity of said electric input signal.

5. An artificial neural function circuit comprising:
a plurality of organic thin film elements;
a plurality of input terminals;
a plurality of output terminals;
each of said organic thin film elements including an organic thin film and at least two metal electrodes, each of said metal electrodes contacting a surface of said organic thin film, one of said metal electrodes being connected to one of said input terminals and receiving an electric input signal, and another of said electrodes being connected to one of said output terminals, wherein electrical resistance of said organic thin film changes in dependence on a said electric input signal and an amount of change per unit time of the resistance of said organic thin film in the direction in which said resistance is decreased is greater than an amount of change per unit time of the resistance in the direction in which said resistance is increased.

6. An artificial neural function circuit comprising:
a plurality of organic thin film elements;
a plurality of input terminals;
a plurality of output terminals;
each of said organic thin film elements including an organic thin film and at least two metal electrodes, each of said metal electrodes contacting a surface of said organic thin film, one of said metal electrodes being connected to one of said input terminals and receiving an electric input signal, and another of said electrodes being connected to one of said output terminals, wherein electrical resistance of said organic thin film changes in dependence on a said electric input signal, said organic thin film holds the changed resistance state for a predetermined time period after removal of said electric input signal and an amount of change per unit time of the resistance of said organic thin film in the direction in which said resistance is decreased is greater than an amount of change per unit time of the resistance in the direction in which said resistance is increased.

7. An artificial neural function circuit comprising:
a plurality of organic thin film elements;
a plurality of input terminals;
a plurality of output terminals;
each of said organic thin film elements including an organic thin film and at least two metal electrodes, each of said metal electrodes contacting a surface of said organic thin film, one of said metal electrodes being connected to one of said input terminals and receiving an electric input signal, and another of said electrodes being connected to one of said output terminals, wherein electrical resistance of said organic thin film changes in dependence on a said electric input signal, the direction in which the resistance state changes depends on the polarity of said electrical input signal and an amount of change per unit time of the resistance of said organic thin film in the direction in which said resistance is decreased is greater than an amount of change per unit time of the resistance in the direction in which said resistance is increased.

8. An artificial neural function circuit comprising:
a plurality of organic thin film elements;
a plurality of input terminals;
a plurality of output terminals;
each of said organic thin film elements including an organic thin film and at least tow metal electrodes, each of said metal electrodes contacting a surface of said organic thin film, one of said metal electrodes being connected to one of said input terminals and receiving an electric input signal, and another of said electrodes being connected to one of said output terminals, wherein electrical resistance of said organic thin film changes in dependence on a said electric input signal, wherein said organic thin film holds the changed resistance state for a predetermined time period after removal of said electric input signal, the direction in which the resistance state changes depends on the polarity of said electric input signal and an amount of change per unit time of the resistance of said organic thin film in the direction in which said resistance is decreased is greater than an amount of change per unit time of the resistance in the direction in which said resistance is increased.

* * * * *